(12) United States Patent
Gonzalez et al.

(10) Patent No.: US 8,736,065 B2
(45) Date of Patent: May 27, 2014

(54) MULTI-CHIP PACKAGE HAVING A SUBSTRATE WITH A PLURALITY OF VERTICALLY EMBEDDED DIE AND A PROCESS OF FORMING THE SAME

(75) Inventors: Javier Soto Gonzalez, Chandler, AZ (US); Houssam Jomaa, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 12/976,903

(22) Filed: Dec. 22, 2010

(65) Prior Publication Data

US 2012/0161331 A1 Jun. 28, 2012

(51) Int. Cl.
*H01L 23/00* (2006.01)
(52) U.S. Cl.
USPC .................. 257/774; 257/777; 257/686
(58) Field of Classification Search
USPC .................. 257/774, 777, 686, E23.178
See application file for complete search history.

(56) References Cited

U.S. PATENT DOCUMENTS

| | | | |
|---|---|---|---|
| 2002/0146859 A1* | 10/2002 | Akagawa | 438/106 |
| 2005/0121765 A1 | 6/2005 | Lin | |
| 2009/0039491 A1* | 2/2009 | Kim et al. | 257/686 |
| 2009/0321932 A1 | 12/2009 | Gonzalez et al. | |
| 2010/0140771 A1* | 6/2010 | Huang et al. | 257/686 |
| 2010/0314780 A1* | 12/2010 | Camacho et al. | 257/777 |
| 2011/0215464 A1 | 9/2011 | Guzek et al. | |
| 2012/0074581 A1 | 3/2012 | Guzek et al. | |

FOREIGN PATENT DOCUMENTS

| JP | 2006-216770 | 8/2006 |
|---|---|---|
| KR | 10-2010-0075259 | 7/2010 |

OTHER PUBLICATIONS

Guzek, John Stephen et al., U.S. Appl. No. 12/655,335 entitled "Semiconductor Package With Embedded Die and Its Method of Fabrication", filed Dec. 29, 2009, 36 pages.
Guzek, John Stephen et al., U.S. Appl. No. 12/890,082 entitled "Die Stacking Using Through-Silicon Vias on Bumpless Build-Up Layer Substrates Including Embedded-Dice, and Processes of Forming Same", filed Sep. 24, 2010, 53 pages.
International Search Report and the Written Opinion of the International Searching Authority, PCT/US2011/061623, Jun. 21, 2012, 7 pages.

* cited by examiner

*Primary Examiner* — Tran Tran
(74) *Attorney, Agent, or Firm* — Blakely, Sokoloff, Taylor & Zafman LLP

(57) ABSTRACT

An apparatus includes a substrate having a land side having a plurality of contact pads and a die side opposite the land side. The apparatus includes a first die and a second die wherein the first die and second die are embedded within the substrate such that the second die is located between the first die and the land side of the substrate.

15 Claims, 14 Drawing Sheets

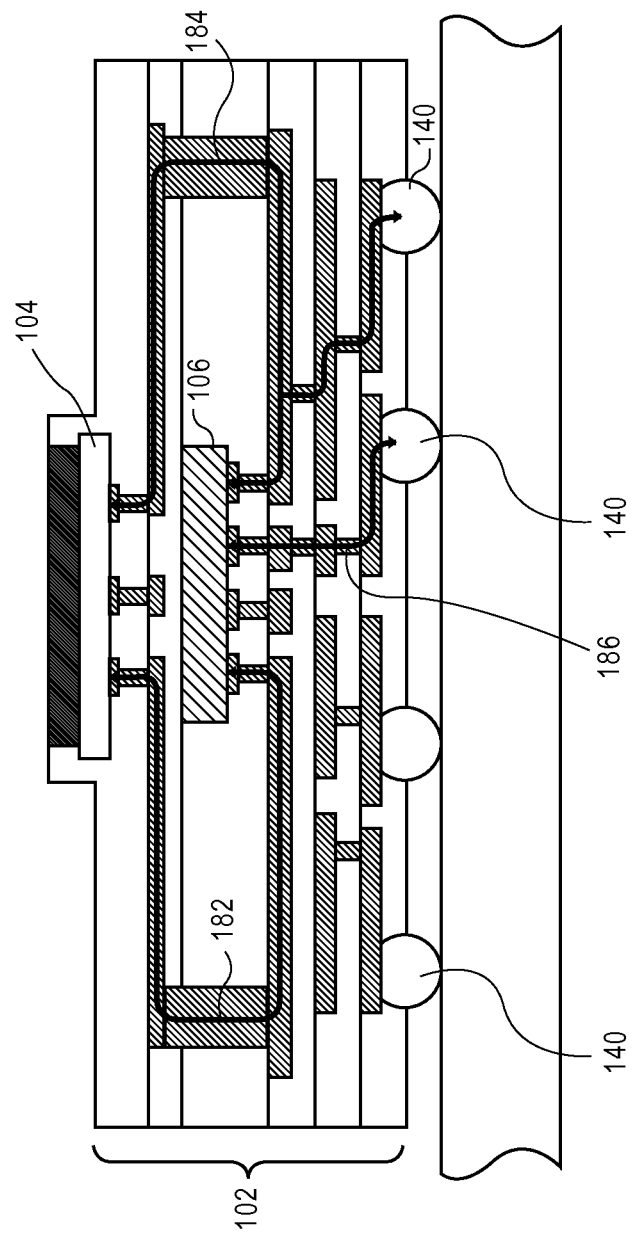

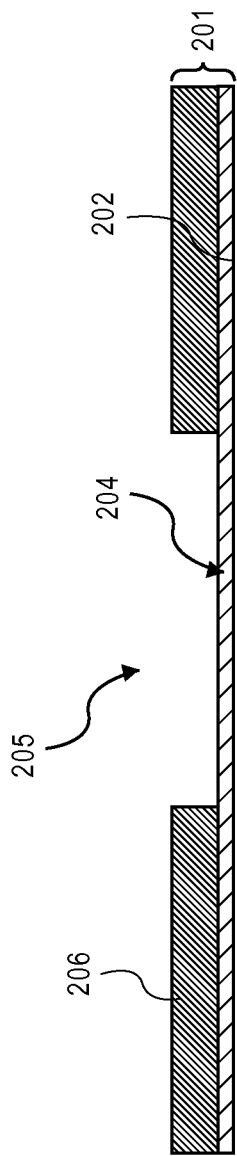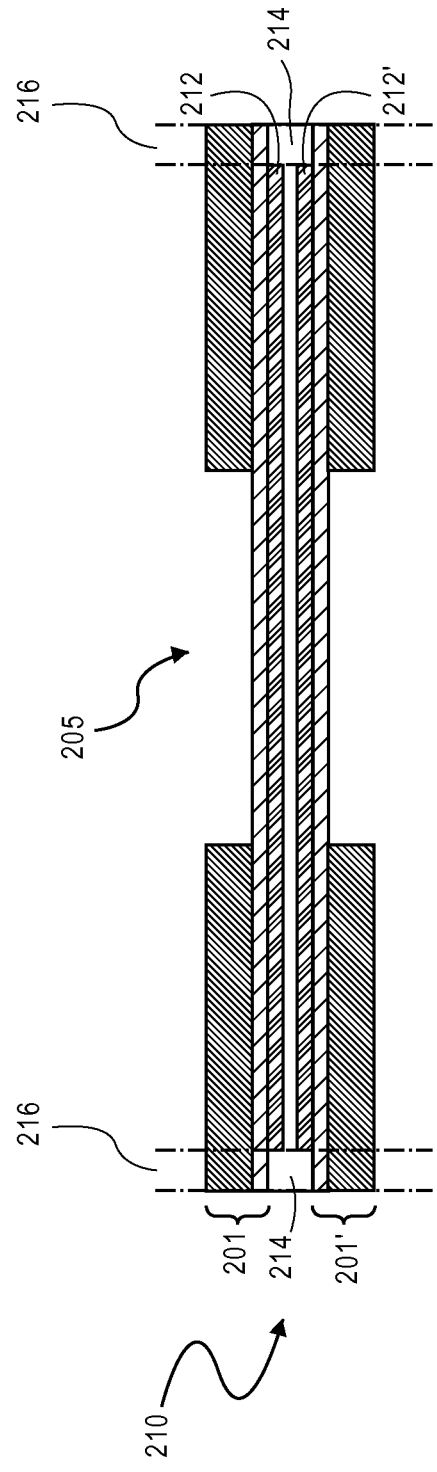

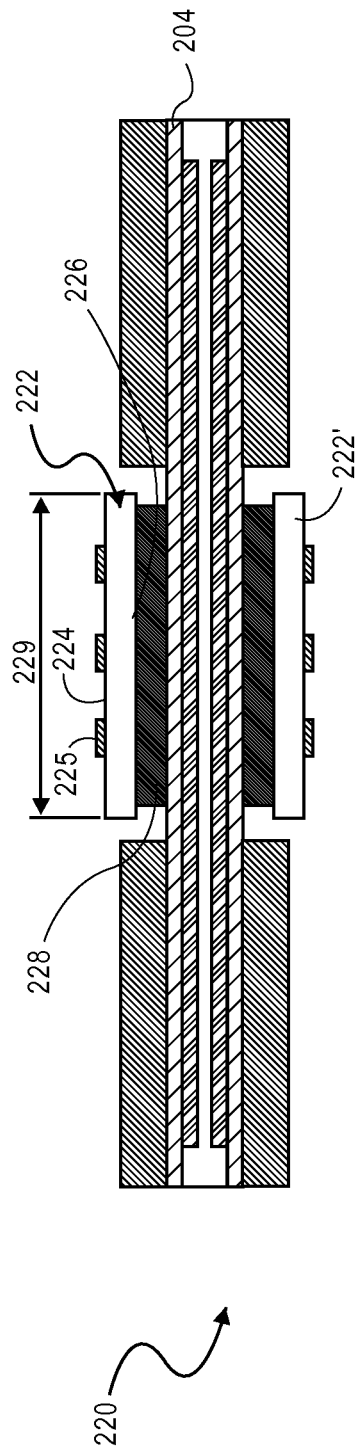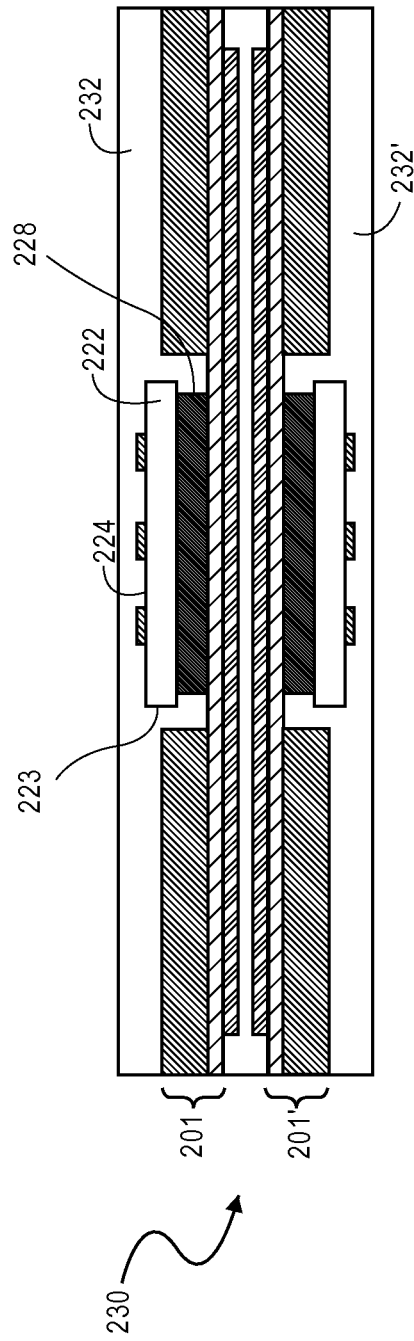

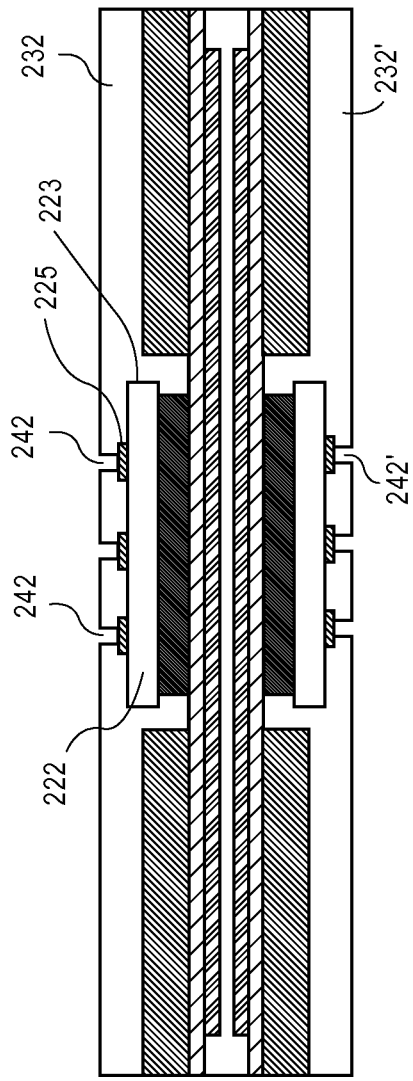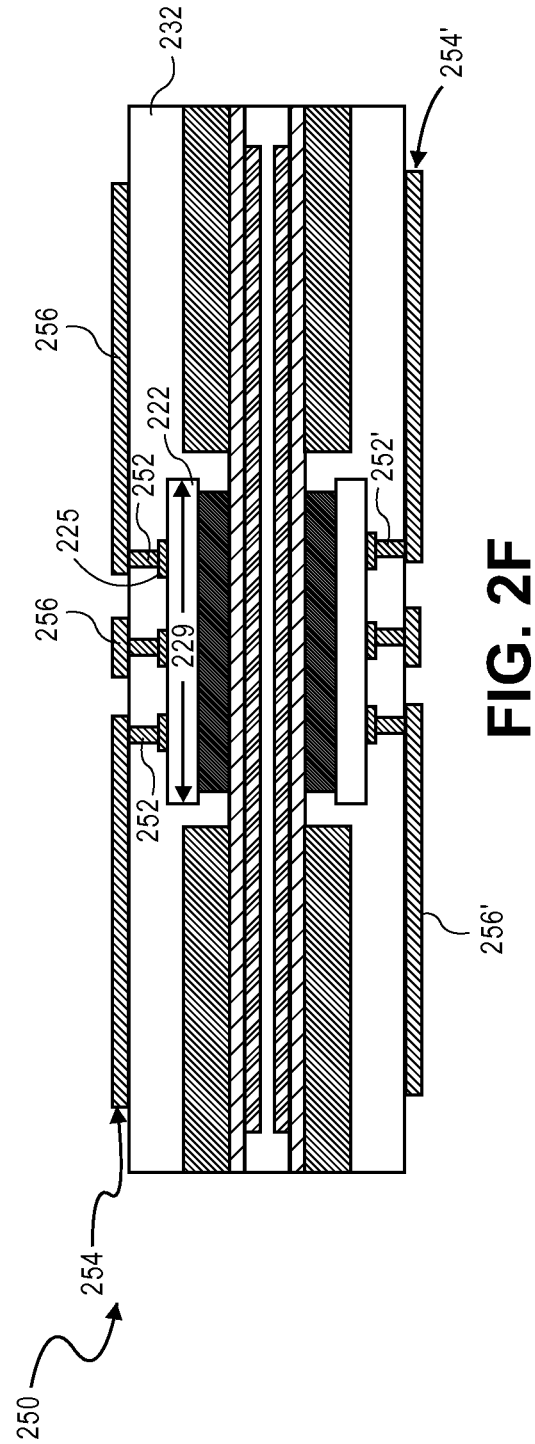

MULTI-CHIP PACKAGE HAVING A SUBSTRATE WITH A PLURALITY OF VERTICALLY EMBEDDED DIE AND A PROCESS OF FORMING THE SAME

BACKGROUND

1. Field

Disclosed embodiments relate to semiconductor microelectronic packages and methods of formation.

2. Discussion of Related Art

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. On the other hand, although scaling is typically viewed as a reduction in size, multiples of packaged die are increasingly coupled together for advanced functionality and horse-power in a computing system. Also, the size of a particular semiconductor package may in fact be increased in order to include multiple die within a single semiconductor package.

However, structural issues may arise when attempting to couple multiples of packaged die. For example, the effect of differences in the coefficients of thermal expansion (CTE) between components used in the semiconductor packages can lead to detrimental defects when adding packaged die together. Similarly, the effect of differences in the coefficients of thermal expansion (CTE) between components used within a single semiconductor package can lead to detrimental defects as a result of performing a semiconductor die packaging process for more than one die within the single package.

Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables mixed technology die stacking or provide package stacking capability while maintaining a thin packaging profile and low overall warpage to be compatible with subsequent assembly process.

BRIEF DESCRIPTION OF THE DRAWINGS

In order to understand the manner in which embodiments are obtained, a more particular description of various embodiments briefly described below will be rendered by reference to the appended drawings. These drawings depict embodiments that are not necessarily drawn to scale and are not to be considered to be limited in scope. Some embodiments will be described and explained with additional specificity and detail through the use the accompanying drawings in which:

FIGS. 1A and 1B illustrate a multi-chip package (MCP) having a plurality of die embedded within a substrate and vertically arranged therein in accordance with an embodiment of the present invention.

FIGS. 2A-2L illustrate a method of forming a multi-chip package (MCP) having a plurality of die embedded within a substrate and vertically arranged therein in accordance with an embodiment of the present invention.

DETAILED DESCRIPTION

Figure 1A:
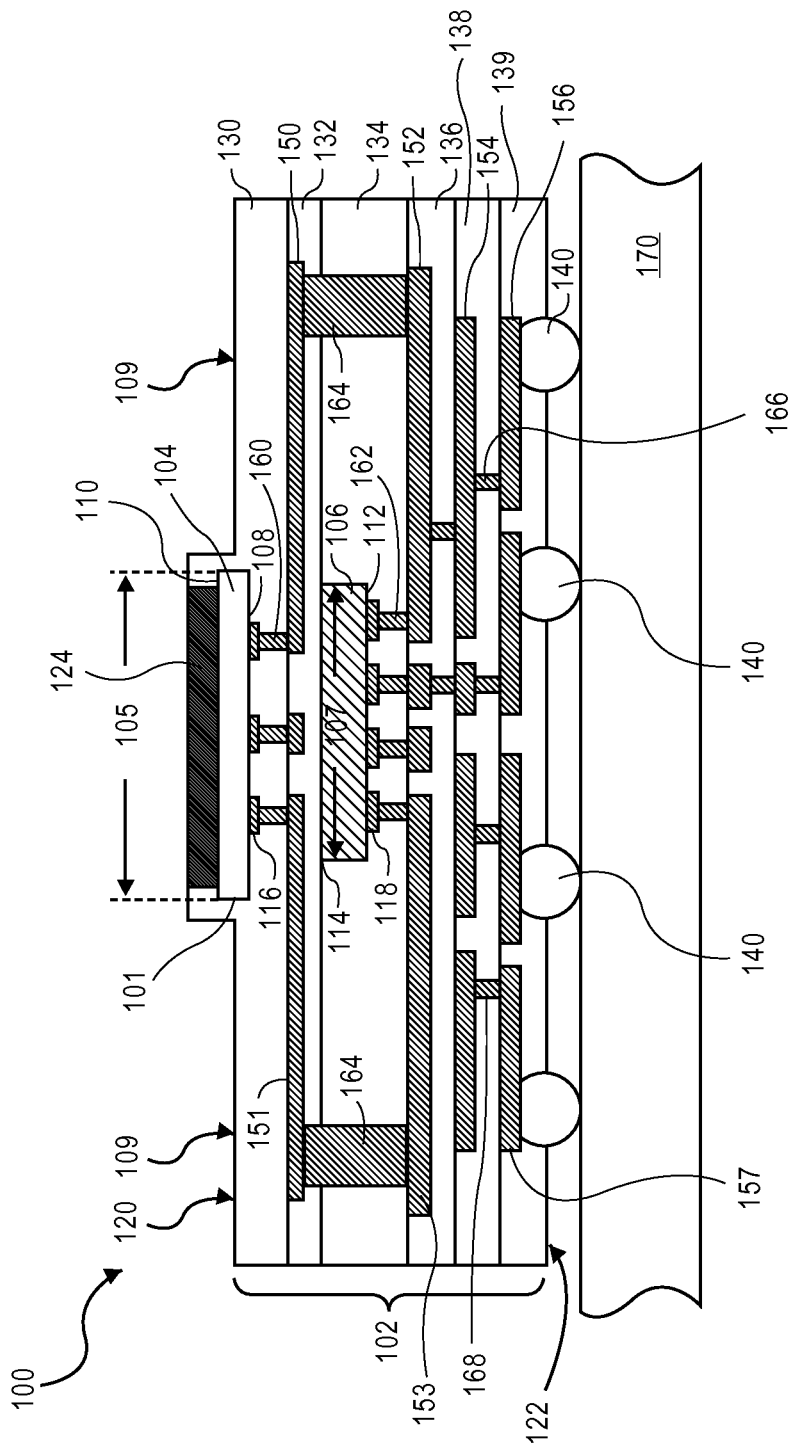

A multi-chip package (MCP) having a plurality of vertically embedded die and its method of manufacture are described. Reference will now be made to drawings wherein like structures may be provided with like suffix reference designations. In order to show the structure of various embodiments more clearly, the drawings included herein are diagrammatic representations of the integrated circuit structures. Thus, the actual appearance of the fabricated integrated circuit structures, for example in a photomicrograph, may appear different while still incorporating the claim structure of the illustrated embodiments. Moreover, the drawings may show only structures useful to understand the illustrated embodiments. Additional structures known in the art may not have been included to maintain the clarity of the drawings. Additionally, in the present description numerous specific details have been set forth in order to provide a thorough understanding of embodiments of the present invention. In other instances, well known semiconductor processing and packaging techniques have not been set forth in specific detail in order to not unnecessarily obscure embodiments of the present invention.

Embodiments of the present invention include a multi-chip package having a substrate with a plurality of vertically arranged die embedded therein. The substrate includes a land side and a die side. A first die and a second die are embedded within the substrate such that the second die is between the first die and the land side of the substrate. The package substrate includes a plurality of routing layers, insulating layers, and vias for creating an interconnection structure within the substrate which provides electrical connection between the first die and the second die. In an embodiment of the present invention, at least one routing layer is located between the first die and the second die. The multi-chip package having a substrate with vertically arranged and embedded die therein in accordance with embodiments of the present invention may be formed with a bumpless build-up layer (BBUL) process. In an embodiment of the present invention, the first die is attached to a temporary carrier and an insulating and routing layer are built over and around the first die embedding the first die therein. A second die is then attached to one of the insulating layers and additional insulating layers and routing layers built up and around the second die thereby embedding the second die within the substrate as well. In this way, both the first and second dies are embedded with the substrate and electrical interconnections are formed within the substrate (substrate routing) that electrically couple the first and second die. The carrier may subsequently be removed to create a coreless substrate.

Embodiments of the present invention enable the formation of the multi-chip package with a thin package configuration and a small footprint thereby saving valuable space on device motherboards. Additionally, embodiments of the present invention enable the electrical connection of two die without the use of package-on-package (POP) technology which requires surface mount technology (SMT) which can be susceptible to reliability issues due to substrate warpage. Additionally, in embodiments of the present invention, a low temperature bumpless build-up layer (BBUL) process is used to form the substrate so as to reduce or eliminate the effects of coefficient of thermal expansion (CTE) mismatch between the embedded dies and the substrate thereby enabling the fabrication of a very planar multi-chip package.

FIG. 1A is an illustration of a cross-sectional view of a semiconductor package 100 having a substrate 102 with a plurality of vertically arranged die embedded therein. In an embodiment of the present invention substrate 102 is a coreless substrate. Substrate 102 has a die side 120 and a land side 122 opposite the die side. Package 100 contains a first die 104 and a second die 106. The first die 104 has an active surface 108 and a back surface 110 opposite the active surface 108. Similarly, second die 106 has an active surface 112 and a back surface 114 opposite the active surface 112. First die and second die may be formed from any well know semiconductor material, such as but not limited to silicon (Si), silicon germanium (SiGe), germanium (Ge) as well as any III-V semiconductor, such as gallium arsenide (GaAs) and indium antimonide (InSb). The active surfaces 108 and 112 include a plurality of semiconductor devices, such as but not limited to transistors, capacitors and resistors interconnected together by a die interconnection structure into functional circuits to thereby form an integrated circuit. As is well know in the art, the die interconnect structure may include any number of metallization layers, such as M1-M11, whose number and thicknesses may vary depending upon a given application utility. The first level of metallization (M1) makes contact with the semiconductor devices of active surface while the last level of metallization (e.g. M11) includes electrical contacts for making connection to the outside world. First die 104 is shown having electrical contacts 116 and second die 106 is shown having electrical contacts 118. In an embodiment of the present invention, active surface 108 of first die 104 and active surface 112 of second die 106 face towards or face in the same direction as a plurality of external conductive contacts 140 formed on substrate 102 as illustrated in FIG. 1A. That is, first die 104 and second die 106 are arranged in a "face down" configuration in substrate 102.

First die 104 has a first footprint or surface area 105 and second die 106 has a second footprint or surface area 107. In an embodiment of the present invention, first die 104 has a larger footprint than second die 106. Second die 106 is embedded within substrate 102 and is positioned between first die 104 and land side 122 of substrate 102. In this way, first die 104 and second die 106 are vertically arranged within substrate 102. In an embodiment of the present invention, at least a portion of footprint 107 of second die 106 lies within the footprint 105 of first die 104. In a embodiment, as illustrated in FIG. 1A, the entire footprint 107 of second die 106 lies within the footprint 105 of first die 104. In an embodiment of the present invention, first die 104 is a memory device, such as but not limited to a static random access memory (SRAM), a dynamic access memory (DRAM), a nonvolatile memory (NVM) and second die 106 is a logic device, such as but not limited to a microprocessor and a digital signal processor.

Land side 122 includes a plurality of conductive contact pads and/or routing traces to which a plurality of external conductive contacts 140 are connected. External conductive contacts 140 provide electrical connection of package 100 to other devices. Substrate 102 includes a plurality of routing layers, insulating layer and vias which together create a substrate interconnection structure. The substrate interconnection structure provides electrical connection between the first die 104 and second die 106 as well as providing electrical connection of the first and second die to external electrical contacts 140 formed on land side 122.

The substrate interconnection structure provides direct electrical connections of first die 104 to second die 106 so that signals may be directly passed between first die and second die. The substrate interconnection structure may also include electrical connections between second die 106 and external conductive contacts 140. In some embodiments of the present invention, the substrate interconnection structure also provides an electrical connection between the first die 104 and external electrical contacts 140. In other embodiments, there are no electrical connections between the external conductive contacts 140 and first die 104. That is, in an embodiment of the present invention, all external connections to first die 104 pass through second die 106. In a specific embodiment, all electrical signals to first die 104, other than power and ground signals, are provided by second die 106.

In a embodiment of the present invention, substrate 102 includes a first insulating layer 130 as illustrated in FIG. 1A. First die 104 is embedded within first insulating layer 130. That is, active surface 108 and sidewalls 101 of first die are in contact with insulating layer 130. A first routing layer 150 comprising a plurality of conductive traces is disposed on first insulating layer 130. A plurality of conductive vias 160 are in first insulating layer 130 and electrically connect conductive traces of the first routing layer 150 to electrical contacts 116 of first die 104. One or more of conductive traces 151 of first routing layer 150 route signals out from the footprint 105 of first die 104 toward an edge of substrate 102. A second insulating layer 132 is disposed on first insulating layer 130 and on first routing layer 150 as illustrated in FIG. 1A. First routing layer 150 is embedded between first insulating layer 130 and second insulating layer 132. The back surface 114 of second die 106 is disposed on second insulating layer 132. A third insulating layer 134 is disposed on second insulating layer 132 and on and around second die 106 as illustrated in FIG. 1A. Second die 106 is embedded within third insulating layer 134 and fully encapsulated and embedded between second insulating layer 132 and third insulating layer 134.

A second routing layer 152 comprising a plurality of conductive traces is disposed on third insulating layer 134. In an embodiment of the present invention, one or more conductive traces 153 of second routing layer 152 route signals from the edge of substrate 102 to within the footprint 107 of second die 106 to provide electrical connection to second die 106. A plurality of conductive vias 162 are formed in third insulating layer 134 between conductive traces of second routing layer 152 and electrical contacts 118 of second die 106 to electrically connect traces of second routing layer 152 to electrical contacts on second die 118. Additionally, a plurality of conductive vias 164 are formed through second insulating layer 132 and third insulating layer 134 to electrically connect traces of second routing layer 152 to traces of first routing layer 150 as illustrated in FIG. 1A.

In an embodiment of the present invention, conductive vias 164 have a diameter larger than conductive vias 162. It is to be appreciated that conductive vias 164 extend deeper into the substrate than do conductive vias 162. In an embodiment of the present invention, vias 164 have a diameter of between 100-150 µm whereas vias 162 have a diameter of between 30-50 µm. Accordingly, by increasing the diameter of conductive vias 164 the aspect ratio (height:width) of conductive vias 164 is reduced enabling the reliable filling of the conductive vias. It is to be appreciated that although via 164 is shown as being completely filled with a conductive film, via 164 may be formed in such a manner that only the sidewalls of via 164 have a conductive film formed therein, and the center remains unfilled. The subsequent formation of an insulating layer may be used to fill the unfilled volume of the via. See for example FIG. 2J.

A fourth insulating layer 136 is disposed on third insulating layer 134 and on and around traces of second routing layer 152. In an embodiment of the present invention, only two routing layers 150 and 152 are provided, one routing layer (150) to provide conductive traces to route signals out from footprint 105 of first die 104 and one routing layer 152 to provide conductive traces to route signals to within footprint 107 of second die 106. If routing layer 152 is the final routing layer of the substrate, a plurality of bond pad openings may be formed in fourth insulating layer 136 to define bond pads on traces 153 of second routing layer to which external electrical contacts 140 are subsequently formed.

If desired, however, additional routing layers, insulating layers and vias may be included depending upon specific routing requirements. For example, a third routing layer 154 comprising a plurality of conductive traces may be disposed on fourth insulating layer 136. A plurality of conductive vias 166 may be formed through fourth insulating layer 136 to provide electrical connection between conductive traces of second routing layer 152 and conductive traces of third routing layer 154. A fifth insulating layer 138 may formed on fourth insulating layer 136 and on and around conductive traces of third routing layer 154.

Still further, fourth routing layer 156 may be disposed on fifth insulating layer 138. If fourth routing layer 156 is the final routing layer it may include a plurality of routing layers/conductive contact pads 157 to which electrical contacts 140 are coupled. Fourth routing layer 156 may also include routing traces 157 to redistribute the location of contact pads. A plurality of vias 168 are formed through fifth insulating layer 138 to electrically couple traces/contact pads of fourth routing layer 156 to traces of the third routing layer 154. A final sixth insulating layer 139, such as a solder mask layer, may be formed on fifth insulating layer 138 and on and around fourth routing layer 156. Opening are formed in solder mask layer 139 to enable external electrical contacts 140 to be attached to the contact pads of routing layer 156.

In embodiments of the present invention, package 100 may include a die attach film (DAF) 124, such as an epoxy based die bonding film (DBF) attached to the back surface 110 of first die 104. In other embodiments, the die attach film (DAF) 124 is removed to enable access to the back surface 110 of first die 104. DAF 124 is not considered part of the substrate 102. Additionally, in embodiments of the present invention, substrate 102 may be a coreless substrate because it is formed on a carrier by a build up layer process where the carrier is eventually removed from the substrate 102. Still further substrate 102 may be considered a coreless substrate because it does not include a thick core such as a fiber reinforced glass epoxy resin.

As illustrated in FIG. 1A, substrate 102 includes at least one routing layer 150 that is located between first die 104 and second die 106. In addition, in an embodiment of the present invention, substrate 102 includes at least one conductive trace, such as conductive trace 151 that has a portion located between the footprint 105 of first die 104 and footprint 107 of second die 106 and a portion which extends outside footprint 107 of second die 106. Additionally, although only a single routing layer 132 is shown in FIG. 1A as being formed between first die 104 and second die 106, one of ordinary skill in the art will appreciate that two or more routing layers may be positioned between first die 104 and second die 106. Additionally, although three routing layers are shown formed between external contacts 140 and second die 106, it is to be appreciated that this only illustrative of an embodiment of the present invention and that more or less routing layers may be formed between second die 106 and external contacts 140 depending upon the necessary routing requirements.

In a embodiment of the present invention external conductive contacts 140 are solder balls arranged in array to provide a ball grid array. The external conductive contacts 140, however, need not necessarily take the form of balls and may have other shapes or structures, such as but not limited to post, bumps, lands and pins. External contacts 140 enable the electrical connection and communication of semiconductor package 100 to a foundation substrate 170. For example, when semiconductor package 100 is part of a computer or handheld device, such as a smart phone or handheld reader, the foundation substrate 170 is a motherboard. In other embodiments, the foundation substrate 170 may be another semiconductor package so as to produce a package-on-package (POP) device.

FIG. 1B is illustration of the package substrate 100 shown in FIG. 1A further delineating specific electrical connections which may be included in substrate 102 in accordance with embodiments of the present invention. In an embodiment of the present invention, substrate 102 includes at least one electrical connection 182 which provides a direct electrical connection between first die 104 and second die 106 where the electrical connection 182 is not electrically connected to an external contact 140. Such connections are useful for signals that are only communicated between the first die 104 and second die 106. For example, when first die 104 is a memory device and second die 106 is a logic device, signals such as address signals, data signal, write enable signals and read enable signals may be passed between first die 104 and semiconductor die 106 by direct electrical connections such as electrical connection 182. Additionally, in an embodiment of the present invention, package substrate 102 may include one or more electrical connections 184 which electrically connect both first die 104 and second die 106 to an external conductive contact 140. In this way, the signal that is provided to the package 100 through electrical contact 140 is provided to both the first die and second die. An example of such a signal may be power and ground signals, such as VCC and VSS. In another embodiment of the present invention, package substrate 102 includes one or more electrical connections 186 which provide a direct electrical connection between external contacts 140 and second die 106 without the signal being directly provided to first die 104. For example, when second die 106 is a logic device, such as a microprocessor, instructions may provided only to second die 106 by a plurality of electrical connections 186. Additionally, although not shown in FIG. 1B, substrate 102 may provide one or more electrical connections between first die 104 and an external electrical contact 140 to enable signals to be provided directly to first die 104 without being provided to second die 106. Embodiments of the present invention include a package substrate 102 which may contain all or some of the electrical connections described above, such as electrical connections 182, 184 and 186.

The semiconductor package 100 having a substrate with a plurality of vertically embedded die includes a fully embedded and surrounded second die 106. As used in this disclosure, "fully embedded and surrounded" means that all surfaces of the second die 106 are in contact with an insulating film of substrate 102. The semiconductor package 100 also includes a fully embedded first die 104. As used in this disclosure, "fully embedded" means that active surface 108 and the entire sidewalls of first die 104 are in contact with an insulating film of substrate 102. However, first die 104 is not "surrounded" since the back surface 110 of first die 104 is not in contact with an insulating film of substrate 102. Two embodiments of "fully embedded" for first die 104 described herein. In a first embodiment, as shown in FIG. 1A, there is one surface (e.g. back surface 110) of the first die the protrudes from the global planarity surface of the die side of substrate 102, e.g. protrudes from surface 109 of substrate 102 depicted in FIG. 1A. In an embodiment, no surface of first die 104 protrudes from the global planarity surface of the die side of substrate 102, e.g. no protrusion from surface 109 of substrate 102.

In contrast to above definitions of "fully embedded and surrounded" and "fully embedded" a "partially embedded" die is a die having an entire surface but only a portion of the sidewalls in contact with an insulating film of a substrate 102. In further contrast, a "non-embedded" die is a die having at most one surface, and no portion of the sidewalls, in contact with an encapsulating film of a substrate.

FIGS. 2A-2L illustrates a method of fabricating a semiconductor package having a plurality of die in embedded within a substrate in accordance with embodiments of the present invention. A carrier 201 is provided. Carrier 201 has an etch-stop layer 202. A second layer 206, such as copper foil, can be etched to create a recess or cavity 205 around a die mounting surface 204. In an embodiment of the present invention, carrier 201 does not include a second layer 206 so that there is no recess or cavity formed in carrier 201.

FIG. 2B illustrates a cross-sectional view during further processing in the fabrication of a package having a plurality die embedded with a substrate in accordance with an embodiment of the present invention. During processing carrier 201 may be mated to an identical structure 201' in order to build a back-to-back carrier 210 for processing utility. Consequently, processing throughput is effectively doubled. Description of the processing on carriers 201 and 201' may be referred to by reference numerals of scribed to the processing of carrier 201 but it may be understood that duplicate processing and structures are produced on carrier 201'. Carrier 210 includes adhesion release layers 212 212' and an adhesive binder 214. A cutting zone 216 is provided at each end of the carrier 210 for separation processing as illustrated further. The back to back carrier 210 may form part of a larger panel with a plurality of identical regions having the cross-section of back to back carrier 210 to enable bulk processing. In an embodiment, such a panel has approximately 1000 cavities 205 where a die can be placed.

FIG. 2C is a cross-sectional view of back to back carrier 210 depicted in FIG. 2B after further processing according to an embodiment of the present invention. Back to back carrier 210 has been further processed by placing a first die 222 onto etch-stop layer 204. First die 222 has an active surface 224 opposite a back surface 226. Active surface 224 includes a plurality of contact pads 225 for making electrical contact to first die 222. First die 222 has a first footprint 229. In an embodiment, the back surface 226 of first die 222 is attached to etchstop layer 202 utilizing an adhesive layer 228, such as epoxy base material or die bonding film (DBF). In an embodiment of the present invention, the die with the larger footprint of the two die to be embedded within the substrate is the attached first die (i.e. is first die 222). Attaching the larger die provides a larger surface area contact with carrier 201 which helps prevent warpage and maintain planarity during the build-up process. In an alternative embodiment, the smaller of the two die is the first die. FIG. 2C also illustrates the addition of first die 222' onto carrier 201' to produce apparatus 220.

FIG. 2D is a cross-sectional view of apparatus 220 after further processing according to an embodiment of the present invention. Apparatus 220 has been processed to receive a first insulating film 232. In an embodiment of the present invention, first insulating film 232 is formed by laminating an insulating film onto carrier 201 and first die 222. After the film is laminated onto carrier 210 and first die 222 it is cured at a suitable temperature, such as about 180° C. In an embodiment of the present invention, first insulating film 232 is an Ajinomoto Build-Up Film (ABF). In an embodiment of the present invention, when carrier 201 includes a second layer 206 forming a cavity 205 and an etch-stop layer 202, first insulating layer 232 is formed in direct contact with the second insulating layer and the etch-stop layer. Insulating layer 232 is formed onto and in direct contact with active surface 224 as well as sidewalls 223 of first die 222. In this way, die 222 is embedded within insulating layer 232. In an alternative to laminating, insulating layer 232 may be formed by spinning on and curing an insulating film. Similarly, a first insulating film 232' may be formed on and around die 222' to produce apparatus 230 illustrated in FIG. 2D.

FIG. 2E is an illustration of the apparatus 230 in FIG. 2D after further processing according to an embodiment of the present invention. A plurality of via holes 242 have been formed though first insulating layer 232 to expose electrical contacts 225 of first die 222. In an embodiment of the present invention, via holes 242 are formed by laser drilling. Laser drilling may be accomplished using a carbon dioxide ($CO_2$) gas laser beam, an ultraviolet (UV) laser beam, or an excimer laser beam. In an embodiment of the present invention, via openings 242 having a diameter of between 30-50 microns are formed. Laser drilling according to embodiments, allow for higher connection density as compared with prior art drilling process to enable small via sizes and pitches and in this way, leading to improved design and to scalable miniaturization at low cost. Additionally, laser drilling enables high alignment accuracy (e.g 10 to 15 micron) and throughput (around 2000 vias/second) and a wide range of possible via sizes (such as between 30 micron and about 300 microns) and low cost (about 2 cents per 1000 vias). The combination of high alignment accuracy and small via size make possible via pitches as low as 60 microns, these pitches being much less than typically plated through hole pitches of about 400 microns used on packages containing cores. Via openings 242' may be similarly formed in insulating layer 232' to provide apparatus 240 illustrated in FIG. 2E.

FIG. 2F is an illustration of the apparatus 240 shown in FIG. 2E after further processing in accordance with an embodiment of the present invention. As illustrated in FIG. 2F, via openings 242 are filled with a conductive material, such as copper, to form a plurality of conductive vias 252 which are electrically connected to contact pads 225 of first die 222. Additionally, a first routing layer 254 comprising a plurality of conductive traces 256, such as copper traces, are formed on first insulating layer 232 and in contact with conductive vias 252 as illustrated in FIG. 2F. In an embodiment of the present invention, at least one conductive trace 256 is formed which is electrically coupled to contact 225 and which extends out to footprint 229 of first die 222 towards the edge of the substrate.

In an embodiment of the present invention, vias 242 are filled to form conductive vias 252 simultaneously with the formation of conductive traces 256 of first routing layer 254 utilizing a semi-additive process (SAP). In a semi-additive process an electroless seed layer, such as an electroless copper seed layer, having a thickness of, for example, less than 1 micron, is formed over the surface of insulating film 232 as well as into via openings 242 and the sidewalls of via openings 242. A photoresist layer is then deposited on the electroless seed layer and exposed to light and developed whereby a resist pattern is formed leaving non-masked regions corresponding to the pattern where conductive traces 256 are desired. Conductive traces 256 and conductive vias 252 are then formed by electrolytic plating, for example, a copper layer, utilizing the electroless copper plating film as a seed layer. Electroplating is continued until vias 252 are completely filled and first conductive traces 256 are formed to a desired thickness, such as between 2-20 microns. The photoresist mask is then removed and a quick touch etch is used to remove the remaining seed layer.

The above described SAP technique can be used to fill vias and form conductive traces at a temperature less than 100° C. and typically between 50-80° C. The use of a semi-additive approach enables thin conductive traces to be formed with fine line and space features, for example, line and space feature of less than 30 microns. Utilizing a semi-additive process (SAP) to fill vias 252 and form first routing layer 254 allows first die 222 to be electrically connected to the package substrate without the use of high temperature processes, such as thermal compression bonding or surface mount technology using lead free solders, which are typically used to electrically connect a die to a package substrate in other packaging technologies, such as with flip chip bonding and wire bonding. By using a low temperature process, such as a process at less than 100° C., to electrically connect first die 222 to the substrate, the substrate and die are not exposed to high temperatures which can lead to package warpage due to the CTE mismatch between first die 222 and layers of apparatus 240. Similar processing may be used to form conductive vias 252' and routing layer 254' to provide apparatus 250 illustrated in FIG. 2F.

Figure 2G:
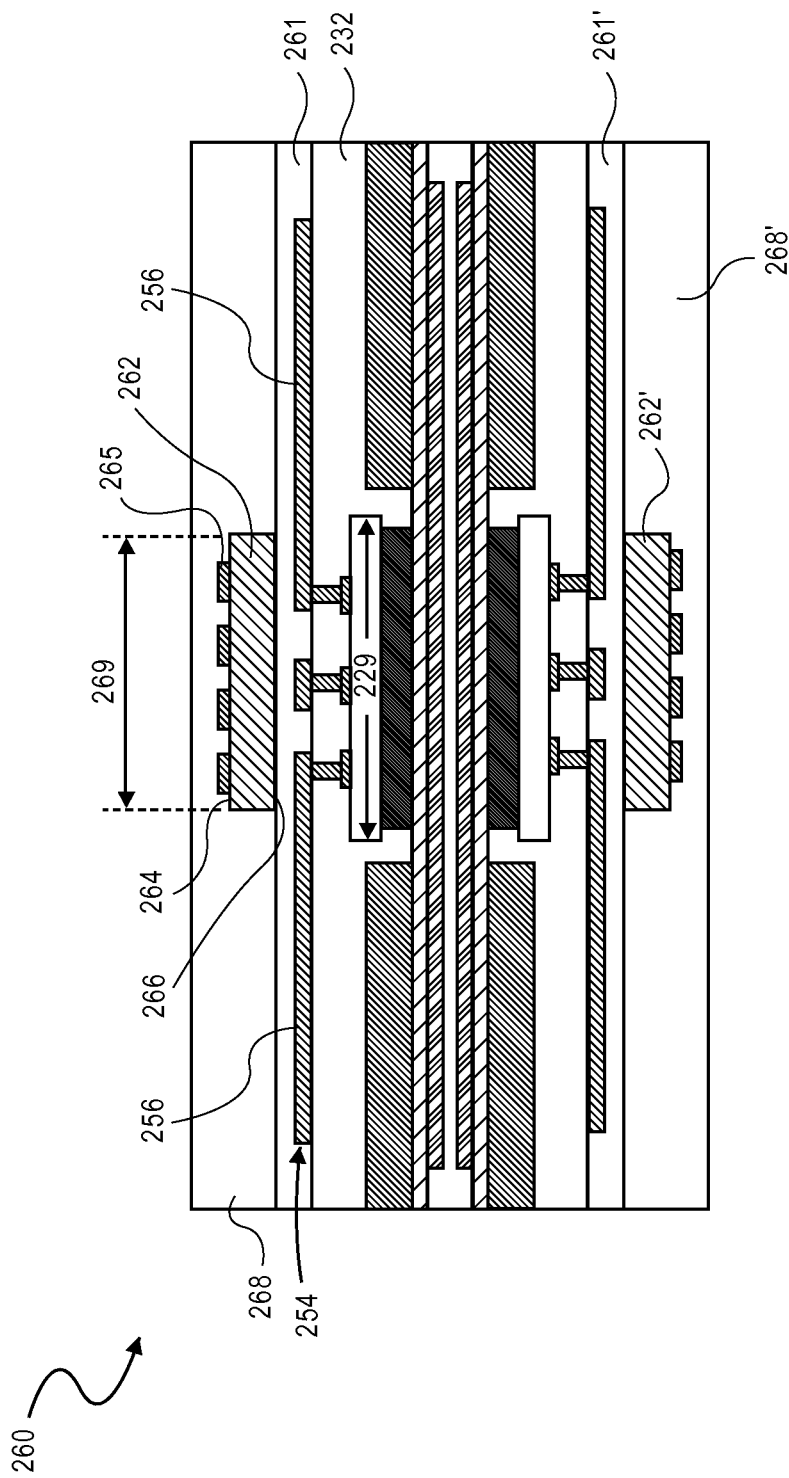

FIG. 2G illustrates the apparatus 250 of FIG. 2F after further processing according to embodiments of the present invention. Apparatus 250 has been further processed to include a second insulating layer 261 and a second die 262 having an active surface 264 and an opposite back surface 266. Active surface 264 of second die 262 includes a plurality of electrical contacts 265 for providing electrical connection to second die 262. Second insulating layer 261 is formed over traces 256 of first routing layer 254 and onto first insulating layer 232 as illustrated in FIG. 2F. The back surface 266 of second die 262 is attached to second insulating layer 261.

In an embodiment of the present invention, the back surface 266 of second die 262 is attached to second insulating layer 261 utilizing the tackiness of second insulating layer 261. For example, in an embodiment of the present invention, an insulating film, such as ABF, is laminated over routing layer 254 and first insulating layer, the insulating film is then only partially cured, at a temperature of, for example, 70° C., in order to maintain the tackiness of the insulating film. Second die 262 is then placed on the partially cured insulating film with the tackiness of the partially cured insulating film securing second die 262. After securing second die 262 the partially cured insulating layer may be fully cured by, for example, heating to a temperature by about 180° C. to form second insulating layer 261. In this way, no adhesive or die attach film is necessary to secure second die 262 to second insulating layer 261. Elimination of a die attach film reduces the step height of the attached second die thereby helping to reduce the topography of second die 262 and enabling subsequent build up layers to be formed more planar.

In an embodiment, second die 262 is located such that at least a portion of footprint 269 of second die 262 lies within footprint 229 of first die 222. In an embodiment of the present invention, second die 262 has a footprint 269 which is smaller than the footprint 269 of first die 222 and second die 262 is positioned on insulating layer 261 so that the entire footprint 269 of second die 262 lies within the footprint 229 of first die 222 as illustrated in FIG. 2G. In an embodiment of the present invention, second die 262 is a logic device, such as a microprocessor manufactured by Intel Corporation or a digital signal processor.

Next, a third insulating layer 268 is formed onto second insulating layer 261 and active surface 264 of second die 262 as shown in FIG. 2G. Second die is fully embedded and surrounded by third insulating layer 268 and second insulating layer 261 as shown in FIG. 2G. In an embodiment of the present invention, third insulating layer 268 is formed by laminating an insulating film onto second insulating film 261 and second die 262 and curing the laminated film as described above. In an embodiment of the present invention, second die 262 is a thin die, such as die having been thinned to a thickness of between 50-150 microns. It is beneficial to provide a thin die 262 so that insulating layer 268 need not be formed too thick in order to fully encapsulate second die 262. In an embodiment, third insulating layer 268 is formed to a thickness of approximately 20-30 microns thicker than the thickness of the second die in order to provide sufficient isolation of the second die from subsequently formed routing layers. It is to be appreciated that if second die 262 is too thick, then third insulating layer 268 must be formed thick making it difficult to construct reliable via connections to conductive traces 256 of first routing layer 254. A second die 262' may be similarly mounted onto a second insulating layer 258' and a third insulating layer 268' formed over second die 262' to produce apparatus 260 illustrated in FIG. 2G.

Figure 2H:
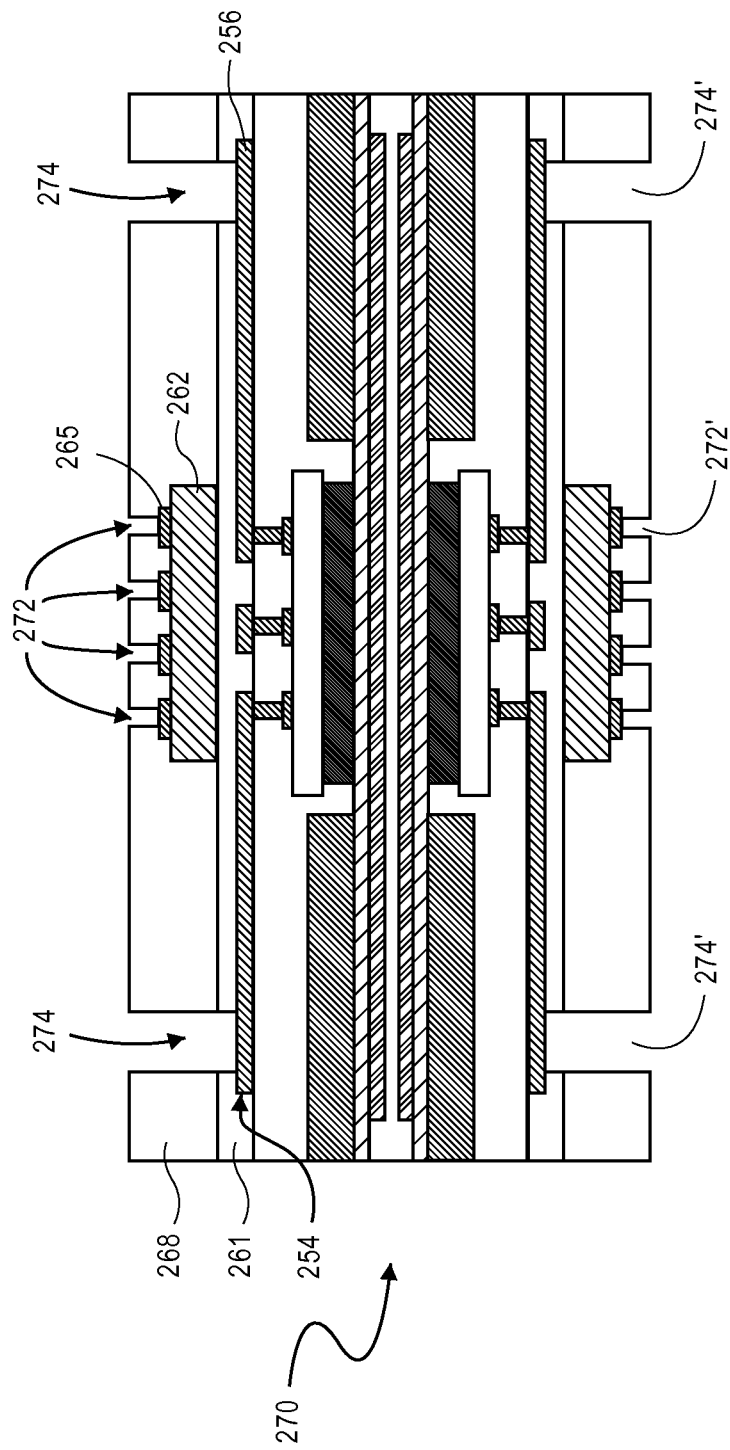

FIG. 2H is an illustration of the apparatus 260 of FIG. 2G after further processing in accordance with an embodiment of the present invention. A plurality of via openings 272 have been formed through insulating layer 268 to expose electrical contacts 265 of second die 262 as illustrated in FIG. 2H. In an embodiment, via openings 272 have diameter between 30-50 μm. Additionally, a plurality of via opening 274 have been formed through third insulating layer 268 and second insulating layer 258 to expose portions of conductive traces 256 of first routing layer 254. In an embodiment, via openings 274 have a larger diameter than via openings 272, such as a diameter of between 100-150 microns. In an embodiment via openings 274 have a diameter of at least two times the diameter of via openings 272. It is to be appreciated that in embodiments the diameter of via openings 274 is, at least in part, determined by the combination of the thicknesses of second insulating layer 261 and insulating layer 268 over conductive traces 254 so that via openings 274 are formed with a manufacturable aspect ratio (height:width). In an embodiment of the present invention, via openings 274 have a larger diameter than via openings 272. In an embodiment of the present invention via openings 274 are formed with a diameter so that via openings have an aspect ratio of about 2:1 or less. In an embodiment of the present invention, via openings 272 and 274 are formed utilizing a laser drilling process as set forth above. Via openings 272' and 274' may be formed in insulating layers 268' and 258' in a similar manner to produce the apparatus 270 illustrated in FIG. 2H.

Figure 2I:
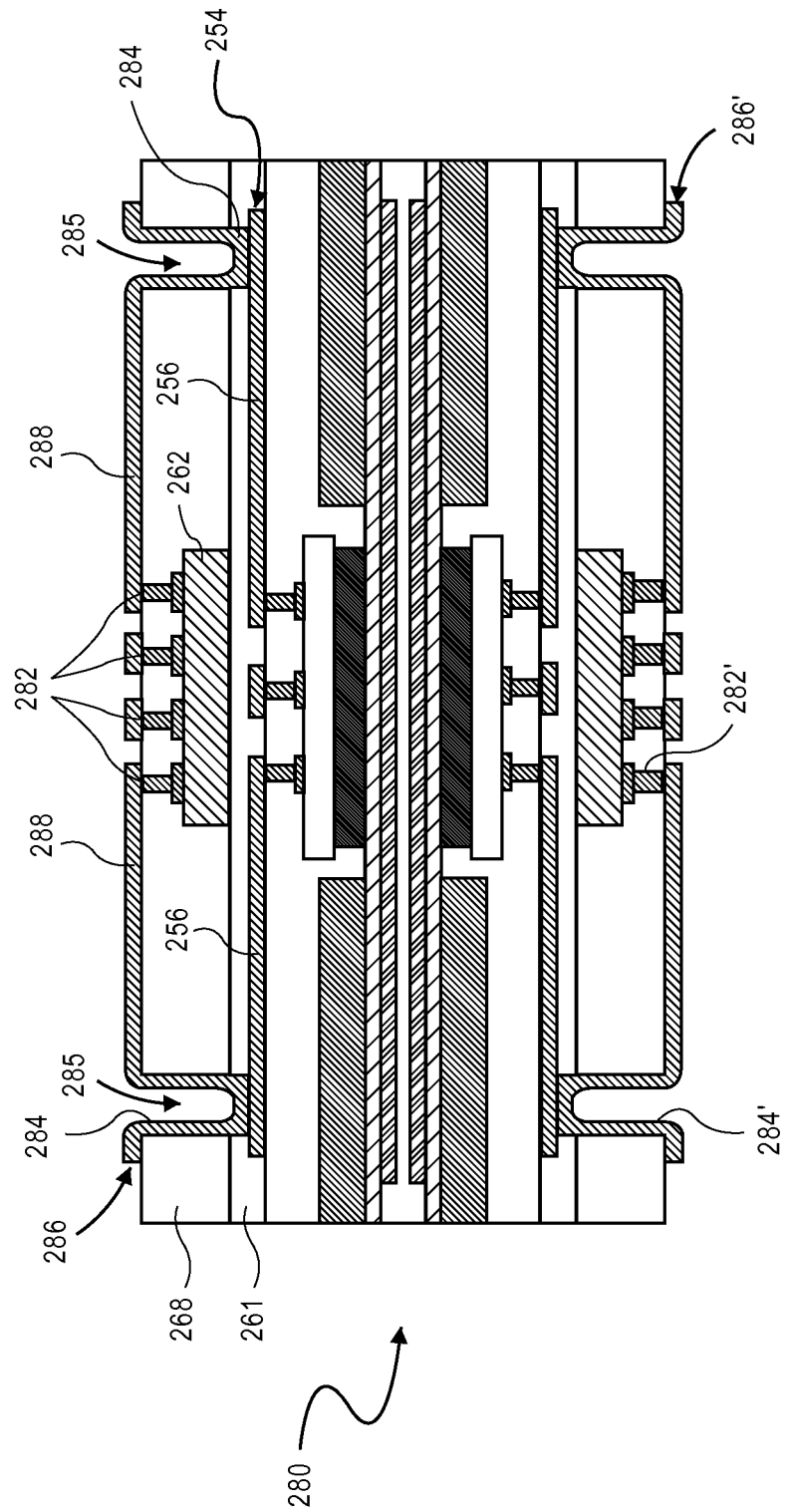

FIG. 2I is an illustration of apparatus 270 of FIG. 2H after further processing in accordance with an embodiment of the present invention. Via openings 272 are filled with a conductive material, such as copper in order to form conductive vias 282 in contact with contact pads 265 of second die 262. Additionally, via openings 274 are filled with a conductive material, such as copper, to provide a plurality of conductive vias 284 in contact with conductive traces 256 of first routing layer 254.

Additionally, apparatus 270 has been further processed to include a second routing layer 286 having a plurality of conductive traces 288. Second routing layer 286 is disposed on third insulating layer 268 as shown in FIG. 2H. In an embodiment of the present invention, at least one conductive trace 288 is formed in contact with both conductive via 282 and conductive via 284. In an embodiment of the present invention, a semi-additive process (SAP), such as described above is used to simultaneously fill vias 282 and vias 284 and form routing layer 286.

In an embodiment of the present invention, the semi-additive process is designed to produce a conductive layer which is thick enough to completely fill small vias 272 to form completely filled conductive vias 282, but which is not thick enough to completely fill large via openings 274. In such a case, the plated film will form conformally on the sidewalls of via 274 forming a "cup" shaped conductive via 284 with an unfilled central portion 285. The use of a semi-additive process enables second die 262 to be electrically coupled to routing layers of the substrate without the use of high temperature solder bonding processes normally used to electrically connect a die to package substrate. Conductive vias 282' and 284' and second routing layers 286 may be similarly formed to produce apparatus 280 illustrated in FIG. 2I.

Figure 2J:
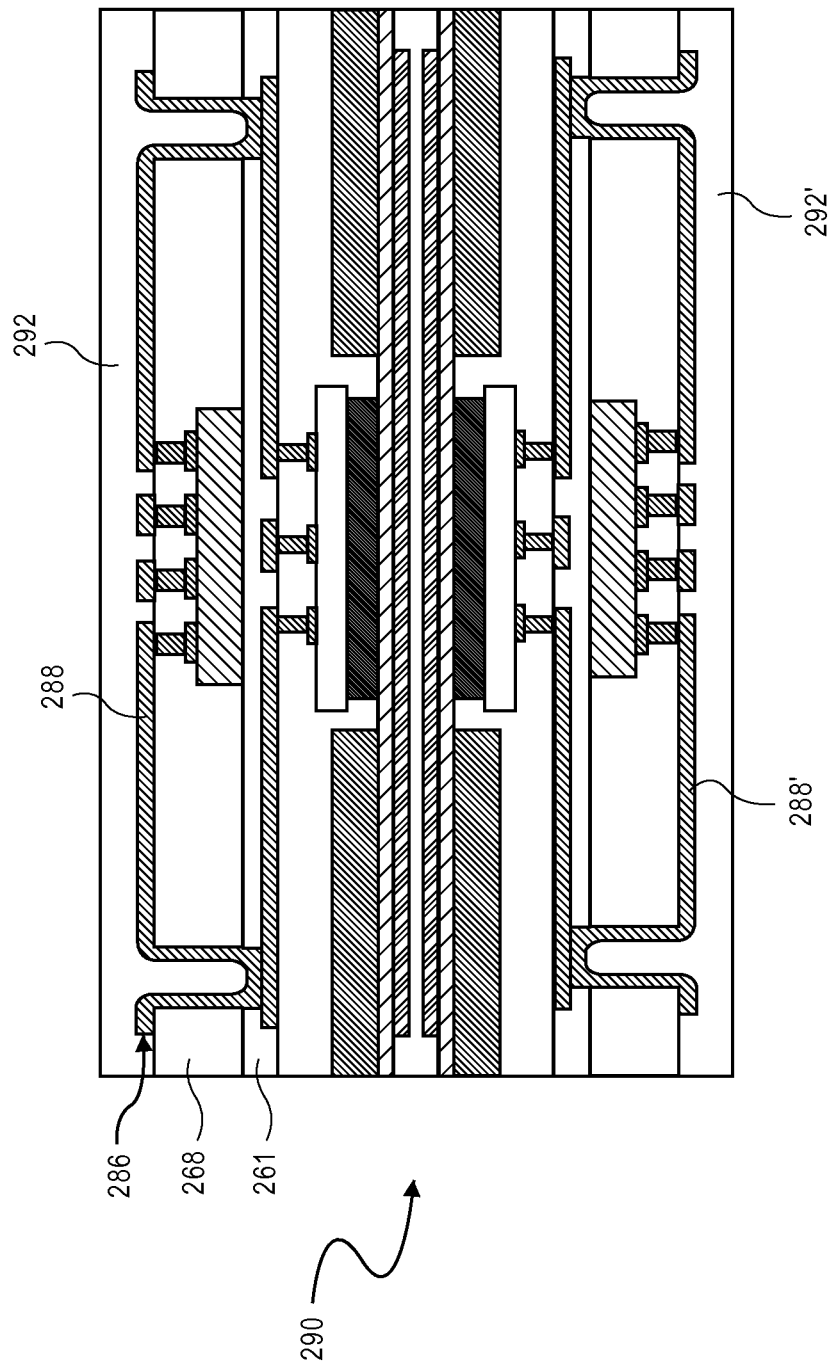

FIG. 2J is an illustration of apparatus 280 of FIG. 2I after further processing in accordance with an embodiment. A fourth insulating layer 292 is formed on second routing layer 286 and on third insulating layer 268. In an embodiment of the present invention, fourth insulating layer 292 is formed by laminating an insulating film onto third insulating layer 268 and second routing layer 286. In an embodiment of the present invention, fourth insulating layer 292 protrudes into unfilled central parts 285 of via 284, as shown in FIG. 2J. A fourth insulating layer 292' may be similarly provided to produce the apparatus 290 illustrated in FIG. 2J. If second routing layer 286 is the final routing layer, the fabrication of the substrate may be completed by forming opening insulating layer 292 to define contact areas or pads in routing layer 286 to which external electrical contacts may be formed.

Figure 2K:
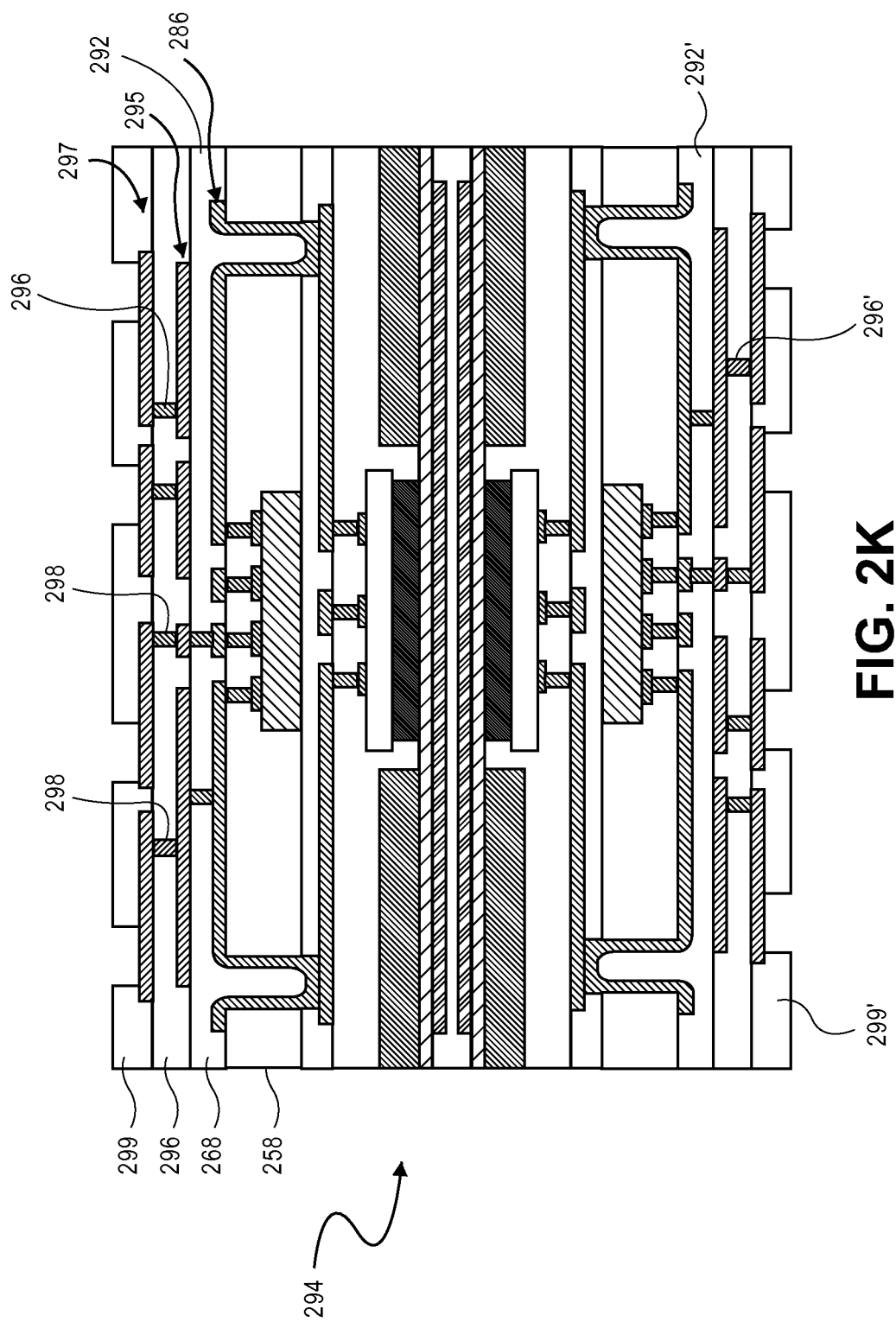

If, however, additional routing functionality is required, one or more additional routing layers and insulating layer along with interconnecting vias may be formed as described above. For example, apparatus 290 of FIG. 2J may be further processed in accordance with an embodiment of the present invention to form additional routing layers and insulating layers. For example, a third routing layer 295 having a plurality of traces may be formed on fourth insulating layer 292 and a plurality of conductive contacts 296 may be formed between traces of third routing layer 295 and second routing layer 286. Additionally, a fifth insulating layer 296 may be formed over third routing layer 295. A fourth routing layer 297 having a plurality of conductive traces may be formed on fifth insulating layer 296 and a plurality of conductive vias 298 formed through insulating layer 296 to electrically couple traces of fourth routing layer 297 to third routing layer 295 as illustrated in FIG. 2K. If fourth routing layer 297 is the final routing layer, a final insulating layer 299 may be formed on fourth routing layer 297 and on fifth insulating layer 296. A plurality of openings are then formed through final insulating layer 298 to expose portions of conductive traces of fourth routing layer 297 to define contact pads thereon. Similar processing may be provided to apparatus 290 to produce apparatus 294 illustrated in FIG. 2K.

Figure 2L:
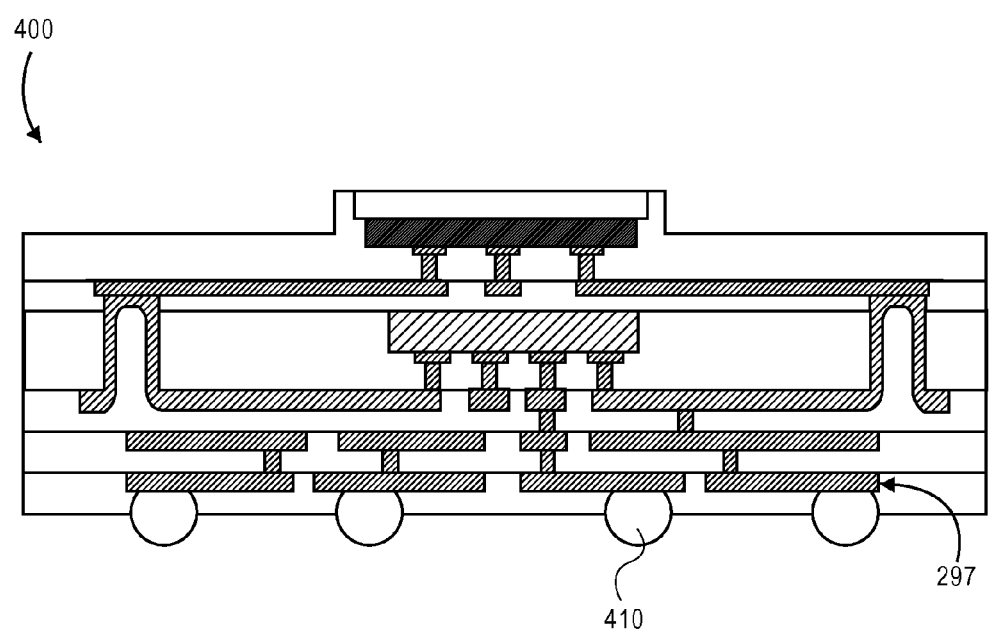

FIG. 2L is a cross-sectional elevation of apparatus 295 of FIG. 2K after further processing. The back to back apparatus have been drawn apart by removing margin material at the cutting zone 216 (FIG. 2B) as well as adhesion release layers 212 and etch-stop layer 204. A fabricated multi-chip package 400 is illustrated. A plurality of external electrical contacts, such as conductive bumps 410 may be provided for electrical communication with a foundation substrate (FIG. 1A). External electrical contacts 410 are disposed upon contact pads of final routing layer 297.

Figure 4:
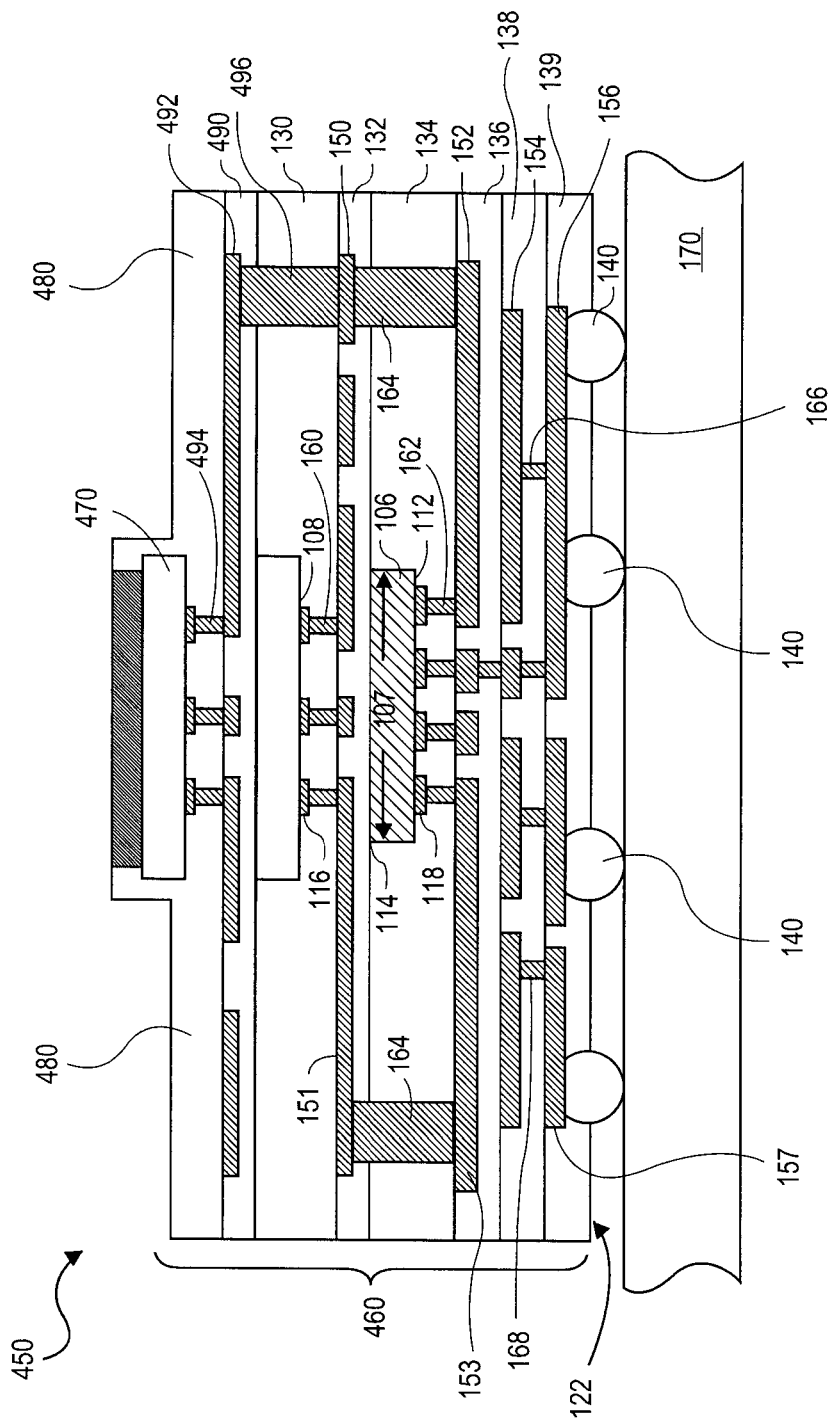
FIG. 4 illustrates a multichip package having more than two die embedded within a substrate and vertically arranged therein in accordance with an embodiment of the present invention.

Although the present invention has been described with respect to a multi-chip package having a substrate 102 with two embedded die, the substrate may include three or more embedded die, if desired. For example, in an embodiment of the present invention, a multi-chip package 450 having a substrate 460 with three embedded die may be formed by embedding a third die 470 in an additional embedding insulating layer 480 formed above first insulating layer 130 as illustrated in FIG. 4. An additional routing layer 492 having a plurality of conductive traces and an additional insulating layer 490 may be disposed between additional embedding insulating layer 480 and third insulating layer 130 as shown in FIG. 4. A plurality of conductive vias 494 may be formed between electrical contacts of third die 470 and an additional routing layer 492 to electrically connect third die 470 to substrate 460. Additionally, a plurality of large conductive vias 496, one of which is shown in FIG. 4, may be formed in additional insulating layer 490 and first insulating layer 130 to electrically connect traces of first routing layer 150 to traces of additional routing layer 492. A plurality of direct electrical connection may be formed between third die 470 and second die 106 using large conductive vias 164 and 496 and routing layers 492, 150 and 152 and small vias 162 and 494. Internal electrical connection may be formed in substrate 460 to connect third die 470 to either second die 106 or first die 105 or to both first die 104 and second die 106 as well as to provide electrical connections between third die 470 and external conductive contacts 140. Additional die, such as a fourth, a fifth and a sixth die, may be similarly embedded, if desired.

Figure 5:
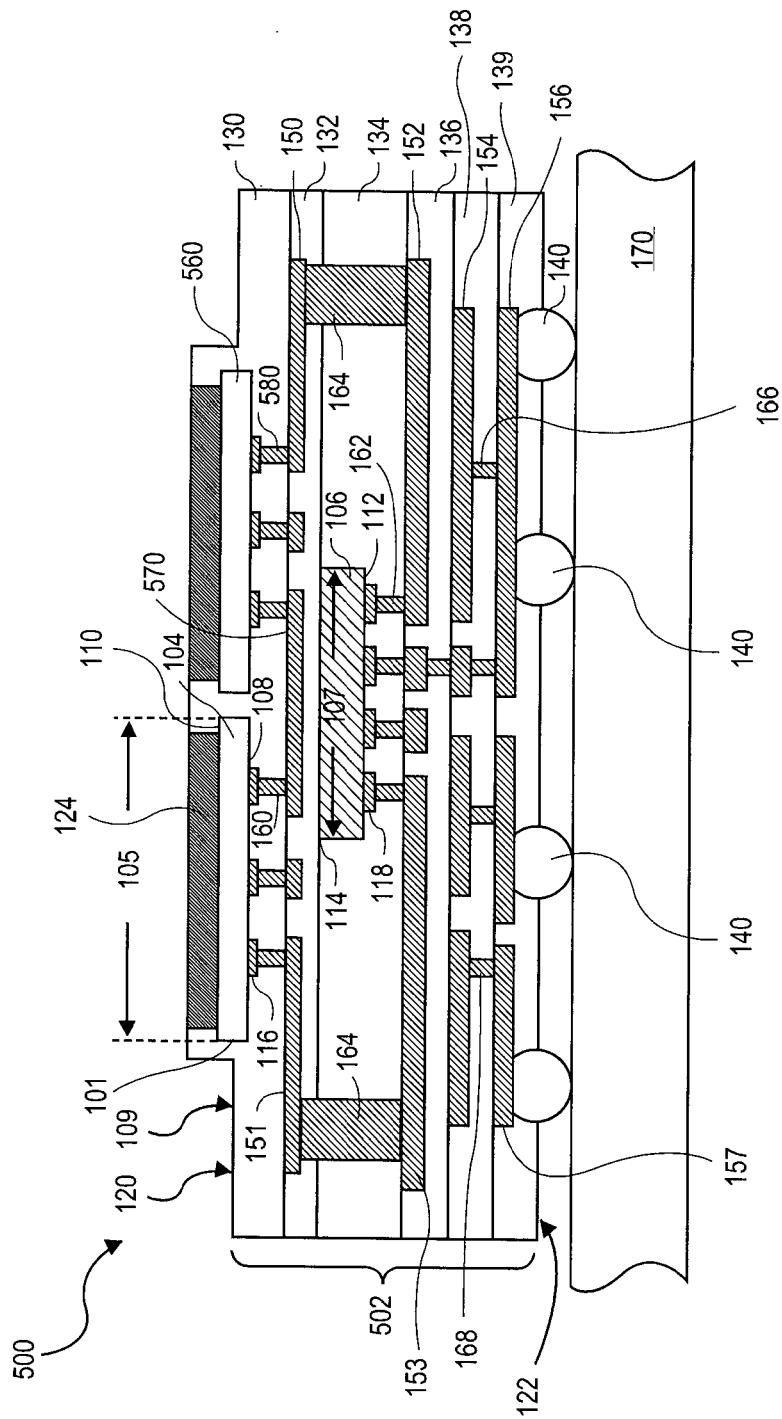
FIG. 5 illustrates a multichip package having more than two die embedded within a substrate and vertically arranged therein in accordance with another embodiment of the present invention.

Additionally, in another embodiment of the present invention, a multi-chip package 500 having a substrate 502 with a third embedded die may be formed by positioning a third die 560 in substrate 102 adjacent to first die 104 as illustrated in FIG. 5. Vias 580 may be included in first insulating layer 130 to provide electrical connection between first routing layer 150 and third die 560 to electrically couple third die 560 to substrate 502. In this way, third die 560 is embedded in insulating layer 130 along with first die 104 as illustrated in FIG. 5. First routing layer 150, vias 160 and vias 580 may be used to provide one or more direct electrical connections 570 between first die 104 and third die 560 as illustrated in FIG. 5. Additionally, first routing layer 150 and second routing layer 152 and vias 164, 162 and 580 may be utilized to provide one or more direct electrical connections between second die 106 and third die 560 as illustrated in FIG. 5.

Multi-chip packages 450 and 500 can be fabricated in a manner as described with respect to FIGS. 2A-2L.

Figure 3:
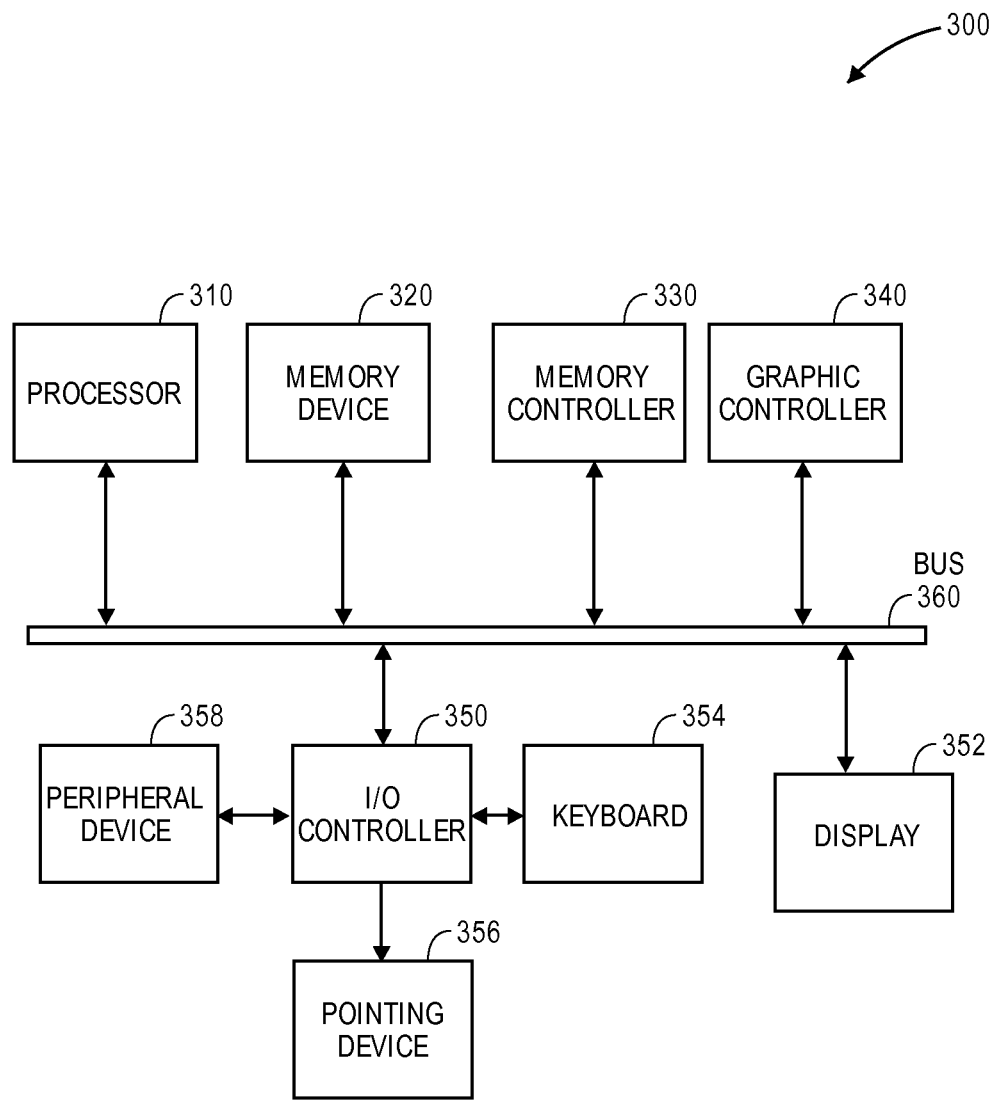
FIG. 3 shows a computer system according to an embodiment of the invention.

FIG. 3 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more integrated circuit packages, such as the package structure 100 of FIG. 1A, for example. For example, processor 310, or memory device 320, or at least a portion of I/O controller 350, or a combination of these components may be included in an integrated circuit package that includes at least one embodiment of a structure described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Thus, a multi-chip package having a substrate with a plurality of vertically arranged die embedded therein and its method of fabrication have been described.

We claim:

1. An apparatus comprising:
a substrate having a die side and a land side opposite the die side said land side having a plurality of contact pads;
a first die having a first active surface and a back surface opposite the active surface;
a first insulating layer, wherein the first die is embedded within the first insulating layer;
a first via in the first insulating layer in electrical contact with the active surface of the first die;
a first routing layer having a first conductive trace on said first insulating layer wherein said first conductive trace is in contact with said first via;
a second die having an active surface and a back surface opposite the active surface;
wherein said first die and said second die are embedded in said substrate such that said second die is located between said first die and said land side of said substrate, and wherein said active surface of said first die and said active surface of said second die face towards said land side of said substrate wherein the first die is directly electrically connected to one of said plurality of contact pads.

2. The apparatus of claim 1 wherein said first die has a first footprint and wherein said second die has a second footprint and wherein at least a portion of said first footprint of said first die is located within the second footprint of said second die.

3. The apparatus of claim 1 wherein said first footprint is larger than said second footprint.

4. The apparatus of claim 3 wherein said footprint of said second die is located entirely within said first footprint of said first die.

5. The apparatus of claim 1 wherein said first die is connected to said second die by an electrical connection embedded entirely within said substrate.

6. The apparatus of claim 5 wherein said electrical connection between said first die and said second die does not include a vertical connection having a diameter greater than 150 microns.

7. The apparatus of claim 1 wherein said second die is embedded in a second insulating layer of said substrate, and wherein a second conductive via in said second insulating layer contacts said active surface of said second die.

8. The apparatus of claim 7 further comprising:
a third insulating layer disposed between said first insulating layer and said second insulating layer; and
a first routing layer comprising a plurality of first traces embedded within said third insulating layer and wherein one of said first traces of said first interconnect layer is formed between said first die and said second die.

9. The apparatus of claim 8 further comprising a fourth insulating layer between said second die and said plurality of contact pads wherein said fourth insulating layer has a second routing layer comprising a plurality of second traces embedded therein.

10. The apparatus of claim 9 further comprising a first plurality of vias having a first diameter in said fourth dielectric between said second routing layer and said second die; and
a second plurality of vias having a second diameter in said third dielectric layer and said second dielectric layer and between said first routing layer and said second routing layer wherein said second diameter is greater than said first diameter.

11. A multi-chip package comprising:
a first die having an active surface opposite a back surface;
a first insulating layer wherein said first die is embedded within said first insulating layer;
a first via in said first insulating layer and in electrical contact with said active surface of said first die;
a first routing layer having a first conductive trace on said first insulating layer wherein said first conductive trace is in contact with said first via;
a second insulating layer on said first routing layer and said first insulating layer;
a second die having an active surface opposite a back surface, wherein said back surface of said second die is on said second insulating layer;
a second insulating layer on said active surface of said second die and said second insulating layer;
a second conductive via in said third insulating layer and in contact with said active surface of said second die;
a second conductive via in said third insulating layer and said second insulating layer and in contact with said first conductive trace of said first routing layer;
a second routing layer having a second conductive trace on said third insulating layer, wherein said second conductive trace is in contact with said second conductive via and said third conductive via; and a fourth insulating layer on said third insulating layer and said second routing layer.

12. The multi-chip package of claim 11 further comprising an insulating film on the back surface of said first die.

13. The multi-chip package of claim 11 wherein said first die has a first footprint and said second die has a second footprint and wherein said first die is located so that said footprint of said first die is at least partially within said footprint of said second die.

14. The multi-chip package of claim 11 wherein said second conductive via has a first diameter and said third conductive via has a second diameter wherein said second diameter is larger than said first diameter.

15. The multi-chip package of claim 11 further comprising a plurality of external electrical contacts.

\* \* \* \* \*

UNITED STATES PATENT AND TRADEMARK OFFICE
CERTIFICATE OF CORRECTION

PATENT NO. : 8,736,065 B2  
APPLICATION NO. : 12/976903  
DATED : May 27, 2014  
INVENTOR(S) : Javier Soto Gonzalez et al.

Page 1 of 1

It is certified that error appears in the above-identified patent and that said Letters Patent is hereby corrected as shown below:

IN THE CLAIMS

Col. 14, Line 59 delete "second" and insert --third--.

Col. 14, Line 63 delete "second" and insert --third--.

Signed and Sealed this
Seventh Day of October, 2014

Michelle K. Lee
*Deputy Director of the United States Patent and Trademark Office*